(12) United States Patent
Bauer et al.

(10) Patent No.: US 7,880,300 B2
(45) Date of Patent: Feb. 1, 2011

(54) SEMICONDUCTOR CHIP COMPRISING A METAL COATING STRUCTURE AND ASSOCIATED PRODUCTION METHOD

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/692,530

(22) Filed: Mar. 28, 2007

(65) Prior Publication Data

US 2007/0228567 A1 Oct. 4, 2007

Related U.S. Application Data

(63) Continuation of application No. PCT/DE2005/001672, filed on Sep. 22, 2005.

(30) Foreign Application Priority Data

Sep. 28, 2004 (DE) .................. 10 2004 047 522

(51) Int. Cl.
*H01L 23/48* (2006.01)
(52) U.S. Cl. .................. 257/739; 257/E23.162
(58) Field of Classification Search ................ 257/751, 257/758, 737, E23.024, E23.162, 739
See application file for complete search history.

(56) References Cited

U.S. PATENT DOCUMENTS

| | | | |
|---|---|---|---|
| 5,060,051 A * | 10/1991 | Usuda .................. | 257/765 |
| 5,816,478 A * | 10/1998 | Kaskoun et al. ........ | 228/180.22 |
| 5,876,580 A | 3/1999 | Lykins, II ............... | 205/104 |
| 6,133,066 A | 10/2000 | Murakami ............. | 438/108 |
| 6,140,702 A * | 10/2000 | Efland et al. ........... | 257/762 |
| 6,335,104 B1 | 1/2002 | Sambucetti et al. .... | 428/615 |
| 6,335,107 B1 * | 1/2002 | Abys et al. ............. | 428/680 |
| 6,831,372 B2 | 12/2004 | Ruhland ................. | 257/783 |
| 2001/0000416 A1 | 4/2001 | Uzoh .................... | 257/781 |
| 2001/0040291 A1 | 11/2001 | Hashimoto ............ | 257/739 |
| 2003/0022479 A1* | 1/2003 | Hayashida ............. | 438/614 |
| 2003/0136813 A1* | 7/2003 | Magerlein et al. ..... | 228/180.5 |
| 2004/0036137 A1 | 2/2004 | Gleason et al. ......... | 257/459 |
| 2004/0084782 A1* | 5/2004 | Magerlein et al. ...... | 257/777 |
| 2004/0232534 A1* | 11/2004 | Seki et al. .............. | 257/678 |

FOREIGN PATENT DOCUMENTS

| | | |
|---|---|---|
| DE | 10148120 A1 | 4/2003 |
| EP | 1139413 A2 | 10/2001 |
| JP | 2001110832 | 4/2001 |
| JP | 200434524 | 5/2004 |
| JP | 2005224886 | 8/2005 |

* cited by examiner

*Primary Examiner*—Steven Loke
*Assistant Examiner*—Kimberly M Thomas
(74) *Attorney, Agent, or Firm*—Banner & Witcoff, Ltd.

(57) ABSTRACT

A semiconductor chip (1) has a metal coating structure (2) which has on an active upper side (3) of the semiconductor chip (1) at least one lower metal layer (8) with copper or copper alloy, on which a central metal layer (9) with nickel is arranged. The metal coating structure (2) is terminated by an upper metal layer (10) of palladium and/or a precious metal. The central metal layer (9) with nickel and/or nickel phosphide has a rough interface (11) with respect to the plastic package molding compound surrounding the metal coating structure (2).

23 Claims, 3 Drawing Sheets

SEMICONDUCTOR CHIP COMPRISING A METAL COATING STRUCTURE AND ASSOCIATED PRODUCTION METHOD

CROSS-REFERENCE TO RELATED APPLICATION

This application is a continuation of co-pending International Application No. PCT/DE2005/001672 filed Sep. 22, 2005, which designates the United States, and claims priority to German application number DE 10 2004 047 522.9 filed Sep. 28, 2004.

TECHNICAL FIELD

The invention relates to a semiconductor chip comprising a metal coating structure and an associated production method.

BACKGROUND

For this purpose, the metal coating structure is arranged on the active upper side of the semiconductor chip above passivation layers. This metal coating structure has copper-containing interconnects and contact terminal areas to contact areas of the semiconductor elements of the semiconductor chip. In this case, a copper-containing metal layer takes over the main load of the power supply and has correspondingly thick interconnect cross sections. These copper-containing layers of the metal tracks are used instead of the otherwise usual aluminum layer to provide a better current-carrying capacity in the case of power semiconductor technologies.

Such a copper-containing current-carrying layer of the interconnects may cover over half the active upper side of the semiconductor chip. In order to permit corrosion protection of the copper and bonding of correspondingly thick aluminum wires, this copper-containing metal area is covered by a sequence of metal layers of NiP/Pg/Au. In order to avoid diffusion of the copper into the passivation layers lying thereunder of the semiconductor chip surface, a lowermost layer of a copper-diffusion-inhibiting material, such as tungsten and/or titanium, is additionally arranged on the passivation layer of the semiconductor chip.

The special characteristic feature of such metal coatings of the semiconductor chip is that they have mirror-smooth surfaces, in order to permit a geometrically and topographically exact coating structure and to ensure reliable corrosion protection for the current-carrying copper layer. Such mirror-smooth surfaces of metal have the disadvantage of poor molding compound adhesion for a polymeric plastic package molding compound on the mirror-smooth metal-coated upper side of the chip. As a result, there is the risk of delamination between the plastic package molding compound and the mirror-smooth surface of the interconnects on the upper side of the chip. This may have the consequence that the metallization and/or the chip passivation become damaged, in particular under changing thermal loads. Moisture can enter by diffusion at the delaminated chip surfaces and may lead, inter alia, to leakage currents and even short-circuits between neighboring interconnects. Furthermore, in the case of microcracks in the passivation layer, moisture diffusion may also penetrate further into the chip and lead there to chip malfunctions.

The poor molding compound adhesion on the upper side of the chip that usually occurs with mirror-smooth aluminum metallizations can be successfully overcome, by applying a polymer layer, for example a photoimide, or by other standard measures for improving the adhesion between the chip surface and the surrounding plastic molding compound, in the case of mirror-smooth aluminum metallizations and/or precious metallizations only because the metallizations have an extremely small topology. This is so because these metallizations are usually less than 1 µm thick, so that the steps in layer thickness on the upper side of the semiconductor chip between the interconnects and the passivation layer are negligible in comparison with the thickness of the polymeric adhesion coatings.

With the extremely great topology of the copper conduction layers, with differences in height sometimes in excess of 5 µm, however, the transferability of this polymer process to improve the adhesion is problematical. The polyimide distributes itself with difficulty and not completely into all the grooves, which causes the metallization structure with such a thickness. This may have the effect when the polyimide is applied of creating voids, in which once again moisture can collect, which may lead to the aforementioned disadvantages. In addition, it would be necessary when curing the polyimide to provide special ovens for the copper-containing metallization, in order to avoid contamination of standard wafers that only have aluminum interconnects. The attempt to adapt the molding compounds in their adhesive property to the uppermost precious metal layers for example is also problematical, especially since these precious metals, such as palladium and gold, appear to be unsuitable from the outset for molding compound adhesion.

Special galvanically deposited ceramic layers, such as are known from the document DE 101 48 120.9, cannot be applied in practice at the semiconductor wafer level, in order to provide them uniformly on all chip surfaces, since these processes, though suitable for the finally mounted semiconductor chip, represent a risk of contamination for installations and equipment in the case of a semiconductor wafer.

However, there is the need to provide these metal coating surfaces with copper-containing layers, suitable for further processing, simultaneously for a number of semiconductor chips at semiconductor wafer level before the semiconductor wafer is separated into individual semiconductor chips, without performing additional process steps.

SUMMARY

The molding compound adhesion of chip surfaces with a high proportion of the surface area made up by copper-containing mirror-smooth metal coating structures can be improved and a semiconductor chip comprising a metal coating structure can be provided which reduces the risk of delamination between a metallization coating structure and a plastic package molding compound. Also, a method can be provided by which a metallization coating structure with improved molding compound adhesion on a semiconductor wafer can be produced for a multiplicity of semiconductor chips in parallel and at the same time.

According to an embodiment, a semiconductor chip may comprise a metal coating structure on the active upper side of the semiconductor chip, the metal coating structure having copper-containing interconnects and contact terminal areas and precious-metal-containing bonding areas on the upper side of the semiconductor chip, and the metal coating structure having a number of metal layers arranged one on top of the other, a copper-containing lower metal layer forming the interconnects and the contact terminal areas, a central metal layer, comprising nickel and/or nickel phosphide, covering the lower metal layer, and upper metal layers, comprising palladium and/or precious metals, covering at least the bonding area regions, and the central metal layer, comprising nickel and/or nickel phosphide, having a rough interface with respect to a plastic package molding compound surrounding the metal coating structure and/or with respect to the upper metal layers.

BRIEF DESCRIPTION OF THE DRAWINGS

The invention is now explained in more detail on the basis of the accompanying figures.

FIG. 1 shows a schematic cross section of an upper side region with passivation layers and a free contact area on a semiconductor wafer in a semiconductor chip position;

FIG. 2 shows a schematic cross section of the upper side region according to FIG. 1 after application of a diffusion-inhibiting metal layer and a copper-containing pre-coating over the full surface area;

FIG. 3 shows a schematic cross section of the upper side region according to FIG. 2 after application of a structured photoresist layer;

FIG. 4 shows a schematic cross section of the upper side region according to FIG. 3 after galvanic deposition of a lower metal layer comprising copper in grooves of the photoresist layer;

FIG. 5 shows a schematic cross section of the upper side region according to FIG. 4 after application of a rough central metal layer comprising nickel;

FIG. 6 shows a schematic cross section of the upper side region according to FIG. 5 after removal of the photoresist layer;

FIG. 7 shows a schematic cross section of the upper side region according to FIG. 6 after removal of the full-area metal layers;

FIG. 8 shows a schematic cross section of the upper side region according to FIG. 7 after completion of the metal coating structure and separation of the semiconductor wafer into individual semiconductor chips;

DETAILED DESCRIPTION

Figure 1:
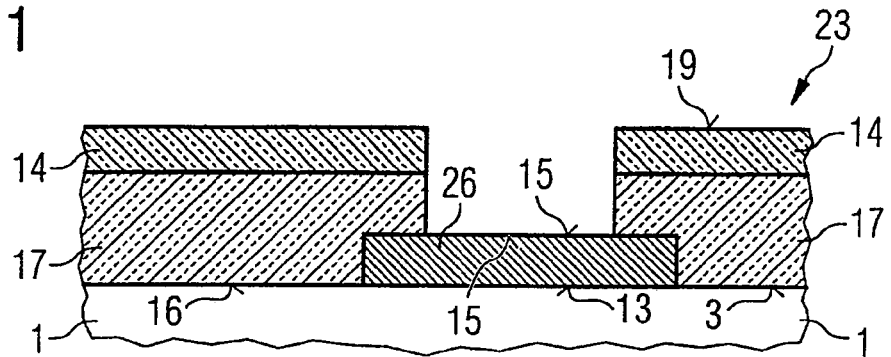
FIGS. 1-8 show schematic cross sections through an upper side region of a semiconductor wafer or semiconductor chip after production steps for a metal coating structure.

According to an embodiment, a semiconductor chip may comprising a metal coating structure can be created on the active upper side of the semiconductor chip, wherein the metal coating structure has copper-containing interconnects and contact terminal areas and also precious-metal-containing bonding areas on the upper side of the semiconductor chip. For this purpose, the metal coating structure has a number of metal layers arranged one on top of the other. A copper-containing lower metal layer forms the interconnects and the contact terminal areas, while a central layer comprises nickel and/or nickel phosphide and covers the lower metal layer. The upper metal layers of precious metals, such as palladium and/or gold, cover at least the bonding area regions of the semiconductor chip. In this case, the central nickel and/or nickel phosphide layer has a rough interface with respect to a plastic package molding compound surrounding the metal coating structure and/or with respect to the upper metal layers.

This semiconductor chip has the advantage that, contrary to the tendency when metal layers are applied to a semiconductor wafer, no mirror-smooth metal surfaces are provided, but instead the semiconductor wafer is provided with a rough metal surface of the metal coating structure for these semiconductor chips with particular adhesiveness with respect to a plastic molding compound. According to an embodiment, this rough metal surface is realized by the central metal layer comprising nickel and/or nickel phosphide. In this case, the semiconductor chip has the advantage that no special processes or additional processes are required for applying these metal layers. It is also possible, according to an embodiment, to dispense with applying polyimides, which simplifies the production processes. The complex application of galvanically deposited ceramic layers can also be omitted, according to an embodiment. Rather, this semiconductor chip may be provided with entirely conventional metallizations, the only difference being that there is no mirror-like deposition of nickel on the copper-containing layer of the interconnects, according to an embodiment. Rather, a rough surface of the central metal layer of nickel or nickel phosphide is provided according to an embodiment, in order in this way to obtain the great surface area of over half the semiconductor chip for intensive adhesion of the surrounding plastic molding compound.

When the precious metal layer is applied to this rough nickel-containing layer, according to an embodiment, it has also surprisingly been found that the bondability of the precious metal layers is not in any way reduced under the roughness now used in practice of the interface of the nickel layer arranged thereunder.

Rather, it has surprisingly been discovered that the bondability is improved, it being possible to use a reduced bonding contact pressure, since the rough points of the nickel coating, which are also replicated in the precious metal coating, are conducive to intensive bonding of bonding wires on the precious metal layer, according to an embodiment. Consequently, the coating sequence for the multi-layered interconnects with a copper-containing metal layer can be retained, without requiring bonding areas with mirror-like surfaces to be selectively kept free for conventional bonding.

According to an embodiment, the roughness of the interface of the central metal layer of nickel and/or nickel phosphide is formed galvanically in a front-end process by variation of the current densities when the nickel is deposited on a semiconductor wafer. In this embodiment, various structures of the rough surface of the nickel can be realized, either having more spherical contours or exhibiting dendritic contours or forming spiked or fibrous contours. In all embodiments, the anchorage of the plastic package molding compound on or to the rough interface is improved in such a way that neither a polyimide layer nor other special transitional layers is/are required to improve adhesion in the region of the copper-containing metallization.

According to an embodiment, the roughness of the central metal layer is so great that there is great adhesiveness with respect to the plastic package molding compound and the roughness of the interface of the central metal layer is so small that the bondability of the bonding areas is still not impaired. However, between these two limiting states there is a broad range for the roughness of the nickel layer, especially since the bondability is only impaired with extremely great roughness and the adhesiveness with respect to the plastic package molding compound is only diminished when virtually a mirror-like surface of the central metal layer is realized.

In a further embodiment, the thickness $d_u$ of the copper-containing metal layer of the metal coating structure is $2 \, \mu m \leq d_u \leq 50 \, \mu m$. As mentioned above, with this extremely great thickness for a metallization structure, conventional adhesion-promoting coatings of polyimide or other adhesion promoters cannot be realized without problems. By contrast, in the case of the metal coating according to an embodiment, an anchorage between metal coating structures and plastic package molding compound can be ensured. Even the application of the uppermost precious metal layers does not reduce the roughness height of the central metal layer of a nickel-containing material arranged thereunder. According to an embodiment, the total thickness $d_o$ of the upper metal layers is preferably 0.1 µm$\leq d_o \leq$1.0 µm. Such an extremely thin metal layer cannot even out the rough structure of the central nickel layer. Rather, the contour of the central metal layer is retained and is possibly even intensified by the upper metal layers, according to an embodiment.

In a further embodiment, the thickness of the average roughness height $t_m$ is 0.05 µm$\leq t_m \leq$1.00 µm. This average roughness height $t_m$ in such a range between 50 nm and 1000 nm has the advantage that intensive interlocking and anchorage of the plastic package molding compound in the interface of the rough nickel layer is ensured. The thickness $d_m$ of the central metal layer of nickel and/or nickel phosphide is preferably 0.1 µm$\leq d_m \leq$1.00 µm, according to an embodiment.

For a further embodiment of the metal coating structure on the semiconductor chip, it is provided that a diffusion-inhibiting metal layer comprising tungsten and/or titanium is arranged between the copper-containing metal layer of the contact terminal areas and the contact areas of the semiconductor chip, which are in connection with the electrodes of semiconductor elements of the semiconductor chip. This metal layer comprising tungsten and/or titanium, according to an embodiment, is intended to prevent copper-containing metal layers in the region of the contact areas of the semiconductor chip from contaminating the semiconductor material. For the other surface regions of the semiconductor chip, a metal layer comprising tungsten and/or titanium is arranged, according to an embodiment, as a diffusion barrier between the copper-containing metal layer of the interconnects and the passivation layers of the upper side of the semiconductor chip. Such a diffusion barrier is intended to prevent copper ions from penetrating into passivation layers and reducing the space-charge zone at p-n junctions near the surface and/or from adversely affecting the blocking capability of the p-n junctions.

Furthermore, according to an embodiment, it is provided that the cross sections of the interconnects of the metal coating structure have such dimensions that the interconnects are capable of carrying source or emitter currents of power semiconductor chips. For this purpose, it is required, as already mentioned above, according to an embodiment, that the cross section of the copper-containing layer is configured with a correspondingly great thickness of between 2 µm and 50 µm. At the same time, the metal coating structure is to cover a proportion of the surface area ΔF of the active upper side of the semiconductor chip of over 50%, i.e. ΔF$\geq$50%, according to an embodiment.

Semiconductor devices with such semiconductor chips are intended in particular for the area of power devices, according to an embodiment. These semiconductor devices have the advantage that the risk of delamination of plastic package molding compound from the metal coating structure is reduced. At the same time, microcracks through which moisture could diffuse and adversely affect the functionality of the semiconductor device are prevented from forming in the plastic package molding compound or in the interface between the plastic package molding compound and the metal coating structure.

A method for producing a number of semiconductor chips comprising a metal coating structure made up of a number of metal layers, according to an embodiment, has the following method steps. Firstly, a semiconductor wafer having semiconductor chip positions arranged in rows and columns and having semiconductor electrode areas on the active upper sides of the semiconductor chip positions is produced.

After that, passivation layers may be applied to the active upper sides of the semiconductor chip positions, while leaving the semiconductor electrode areas free. Then, the semiconductor electrode areas can be reinforced by coating to form contact areas. There then follows a selective galvanic or chemical deposition of a lower metal layer comprising copper or copper alloy. This involves forming interconnects, contact terminal areas on the contact areas and bonding area regions. After that, a selective galvanic deposition of a rough nickel coating is performed as a central metal layer on the lower metal layer. Then, upper metal layers of a coating comprising palladium and/or a precious metal may be applied to the central metal layer, at least in the bonding area regions. After this multi-layered coating, the semiconductor wafer is separated into individual semiconductor chips.

This method has the advantage that the depositing of a rough nickel coating as a central layer of a metal coating structure on the semiconductor chip or the semiconductor wafer creates an interface which ensures during subsequent steps, such as the embedding of the semiconductor chip into a plastic package molding compound, reliable anchorage and adhesion between the metal surfaces of the wiring structure of the individual semiconductor chips and the plastic package molding compound in spite of the extremely great topology of the wiring structure. Consequently, the rough nickel on the upper side of the chip permits improved molding compound adhesion in comparison with the prior art. Since the production of the rough surface of the semiconductor chips or of the semiconductor wafer can be integrated in the front-end process, it is possible to dispense with further additional adhesion promoters and the accompanying additional process steps. Consequently, a chip surface which has very good adhesion with respect to the plastic package molding compound is obtained, so that such a front-end technology can meet increased requirements of the market with respect to quality and price without applying a polymeric adhesion promoter, such as a polyimide layer.

In a further example of how the method is carried out, after the application of the passivation layers and after reinforcing the semiconductor electrode areas to form contact areas, an electrically conducting material is applied to the entire surface of the semiconductor wafer, according to an embodiment, in order to prepare the surface for galvanic depositing of the copper-containing layer. According to an embodiment, the entire surface is transformed into an electrically conducting state by physical deposition of an electrically conducting material by means of sputtering or vapor deposition or plasma coating. This application of an electrically conducting layer may involve the application of a diffusion-inhibiting metal, in that even before the copper-containing metal layer is applied the semiconductor wafer, and with it the semiconductor chip positions, are coated with tungsten and/or titanium, which are known as diffusion barriers for copper ions and copper atoms.

These metallic coatings consequently perform two functions, on the one hand they ensure that a copper layer several micrometers thick can be galvanically deposited and on the other hand they do not allow any copper ions and copper atoms to diffuse into the passivation or oxide layers lying thereunder. Consequently, the tungsten and/or titanium layers protect in particular the space-charge zones of the semiconductor material, which extend up to the surface and are consequently particularly at risk.

In a further embodiment of how the method is carried out, after the deposition of an electrically conducting material on the entire surface, the regions of the surface on which no lower copper-containing or copper-alloy-containing metal layer is to be deposited are protected with a photoresist layer. As long as this photoresist structure is on the semiconductor wafer, all the metal layers that are to be selectively applied one on top of the other to form a metal coating structure can be applied by a wide variety of methods. Even electroless depositing methods are possible for the further metal layers. Once the uppermost layer, which in this case comprises a palladium and/or precious metal layer, has been structured and selectively applied to the regions of the semiconductor wafer that are not protected by photoresist, the photoresist layer can be removed. Subsequently, the conducting coating of preferably tungsten and/or titanium arranged thereunder can be removed in a self-adjusting manner, the completed metal coating structure serving here as a mask.

If the conductivity of a tungsten and/or titanium coating is not sufficient to provide adequate current for the galvanic deposition, a thin copper layer may be applied on the entire upper side of the semiconductor wafer, on the tungsten and/or titanium layer, as a pre-coating or seed layer for the depositing of the lower copper layer. This copper-containing seed layer may likewise be removed at the end of the process, after the removal of the photoresist with the tungsten and/or titanium layer lying thereunder.

FIGS. 1-8 show schematic cross sections through an upper side region 16 of a semiconductor wafer or a semiconductor chip 1 after production steps for a metal coating structure 2. Components with the same functions in FIGS. 1-8 are identified by the same designations and are not explained more than once.

FIG. 1 shows a schematic cross section of an upper side region 16 with passivation layers 14 and free contact areas 15 on a semiconductor wafer in a semiconductor chip position 23. The contact area 15 is arranged on a semiconductor electrode area 13, which is in connection with corresponding electrodes of the semiconductor elements, for example of an integrated circuit, by means of interconnects. The conducting layer 26, which connects the free contact area 15 to the buried semiconductor electrode area 13, is produced from an electrically conducting material which may be both a highly doped semiconductor material, such as polysilicon, or a metal. The free contact area 15 is surrounded by an insulating layer 17 of silicon dioxide, which is arranged directly on the active upper side 3 of the semiconductor chip 1, and a passivation layer 14, which for example comprises silicon nitride, which protects the active surface 3 of the semiconductor chip 1.

Figure 2:
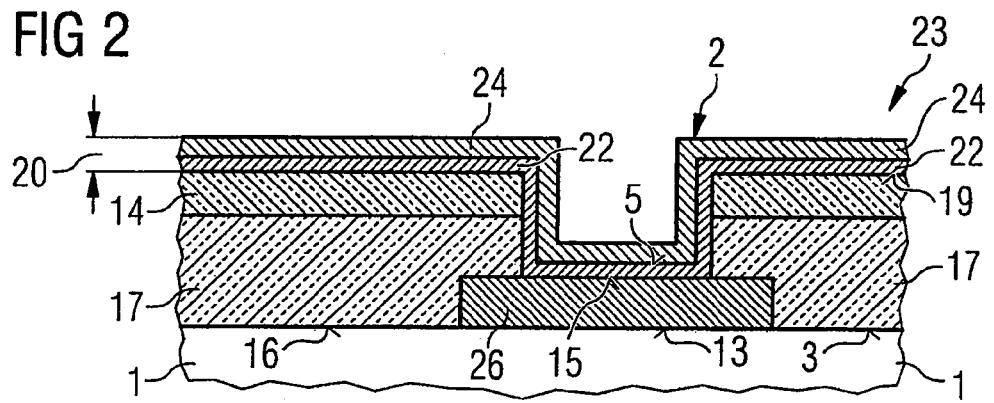

FIG. 2 shows a schematic cross section of the upper side region 16 according to FIG. 1 after full-area application of a diffusion-inhibiting metal layer 22 and a copper-containing precoating 24 to the entire area 19 of a semiconductor wafer. The diffusion-inhibiting metal layer 22 of this embodiment is a sputtered-on layer, which may be applied to the entire semiconductor wafer and is consequently also present in this semiconductor chip position 23. A precoating 24, with good electrical conduction and containing copper, is applied to this diffusion-inhibiting metal layer 22, of tungsten and/or titanium and a few nanometers thick, in order to create a correspondingly thick lower metal layer 22 comprising copper in the subsequent method steps in the galvanic process.

Figure 3:
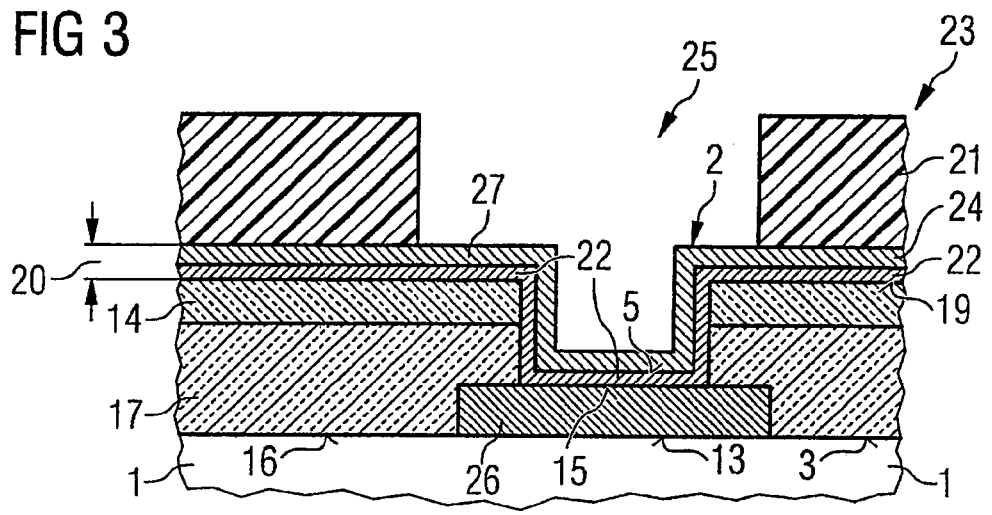

FIG. 3 shows a schematic cross section of the upper side region 16 according to FIG. 2 after application of a structured photoresist layer 21. This photoresist layer 21 on the one hand delimits the interconnect width that is to be deposited on the precoating 24 and on the other hand delimits the individual positions of the contact areas 15 of the semiconductor chip 1 that are to be connected by means of the interconnects.

Such structured photoresist layers 21 are introduced with the aid of so-called photolithography, in that for example a non-cured layer completely covers the semiconductor wafer and a pre-crosslinkage is performed by exposure of metal regions of the photoresist layer 21, which are not attacked in the subsequent development process by corresponding developers or solvents, so that only the regions of the photoresist that are to be galvanically provided with a lower copper layer are developed free from photoresist. In this case, grooves 25 are formed in the photoresist coating and can subsequently be galvanically filled with corresponding metal layers to form contact terminal areas 5. In a subsequent curing step, the photoresist can be further crosslinked, so that it retains the structure in an electrolytic bath.

Figure 4:
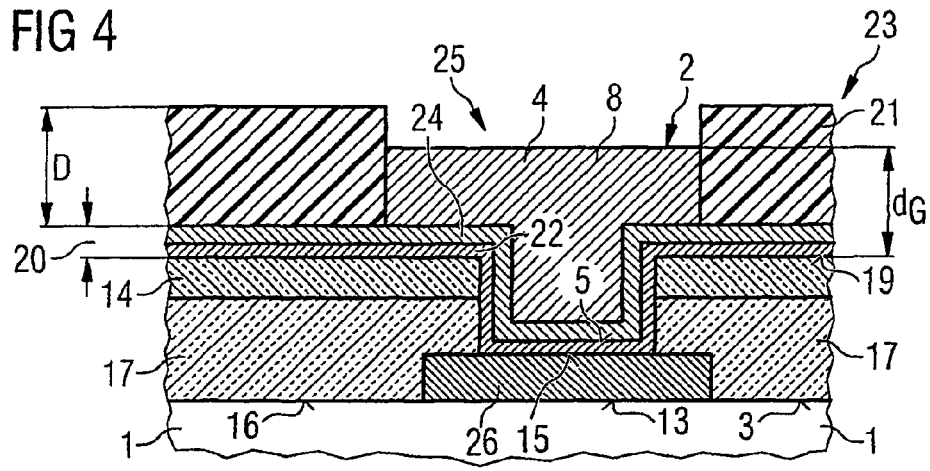

FIG. 4 shows a schematic cross section of the upper side region 16 according to FIG. 3 after galvanic deposition of a lower metal layer 8 comprising copper in the grooves 25 of the photoresist layer 21. In this way of carrying out the method, the photoresist 21 is applied in a thickness D which is thicker than the total thickness $d_G$ of the metal layers 8, 22 and 24 stacked one on top of the other.

Figure 5:
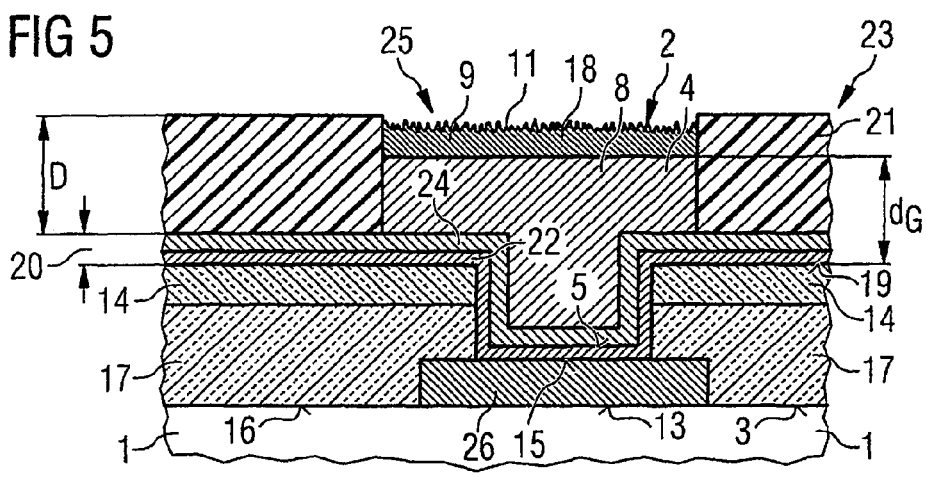

FIG. 5 shows a schematic cross section of the upper side region 16 according to FIG. 4 after application of a rough central metal layer 9 comprising nickel. In this case, the nickel is deposited with a different current density in a galvanic bath for nickel that is separate from the galvanic copper bath, so that, by the variation of the current density, a smooth nickel upper side is not built up, but instead a relatively fissured rough upper side 18 of the deposited nickel is produced as a rough interface 11 of the rough nickel coating 18. Since the thickness D of the photolithographic layer 21 is thicker than the total thickness $d_G$ of the metal layers, the structured photoresist layer 21 may also serve for selective depositing of the rough nickel coating 18.

Figure 6:
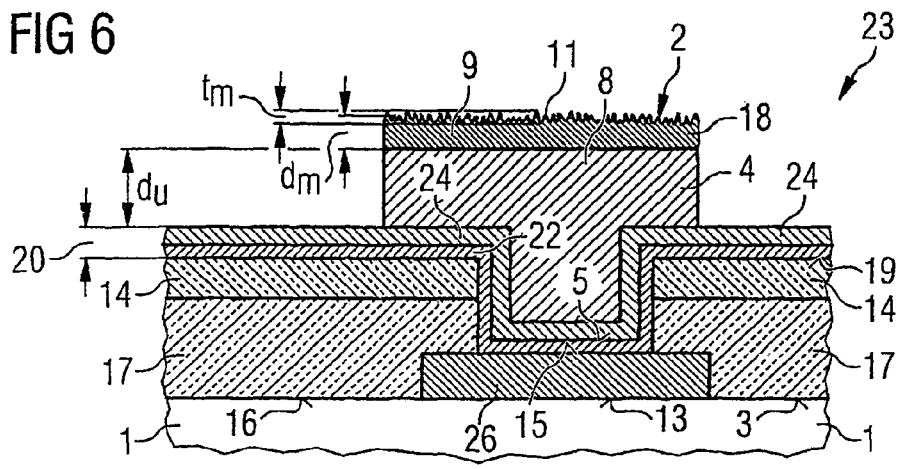

FIG. 6 shows a schematic cross section of the upper side region 16 according to FIG. 5 after removal of the photoresist layer 21. The average roughness height $t_m$ of the rough interface 11 is 0.05 $\mu m \leq t_m \leq 1.00$ $\mu m$. The thickness $d_u$ of the lower copper-containing metal layer 8 arranged thereunder of the metal coating structure is 2 $\mu m \leq d_u \leq 50$ $\mu m$ and the thickness $d_m$ of the central metal layer 9 of nickel is 0.1 $\mu m \leq d_m \leq 1.00$ $\mu m$.

Figure 7:
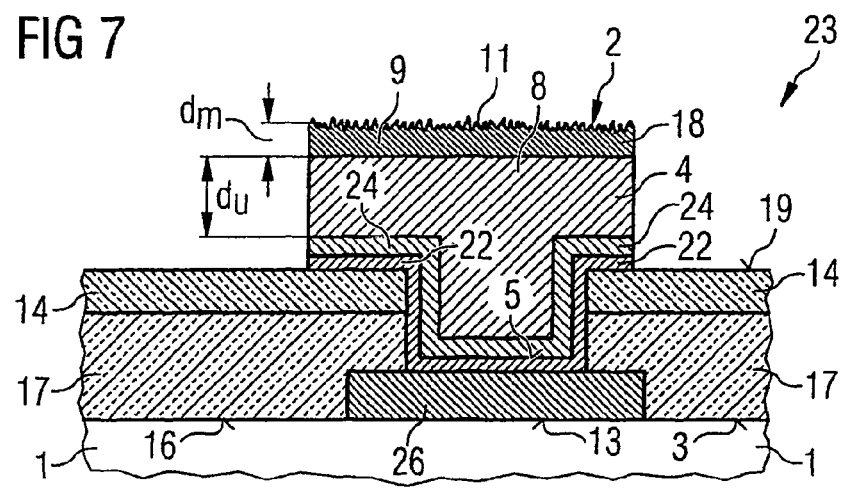

FIG. 7 shows a schematic cross section of the upper side region 16 according to FIG. 6 after removal of the full-area metal layers 22 and 24. Since the thickness of these metal layers 22 and 24 is very small and may only lie in the range of a few nanometers, the existing structure of thick metallic layers may form an etching mask for etching away these full-area coatings 22 and 24, so that no further adjusting step is required. To protect the rough nickel coating 18 from corrosion, it is provided with a thin palladium and/or precious metal coating. These upper metal layers 10 of a thin palladium and/or precious metal coating in the range of a few nanometers to a micrometer have the effect that the roughness of the nickel coating 18 or the rough interface 11 of the nickel coating is reflected on the surface of the palladium and/or precious metal layer. Bonding on this rough bonding area 6 is unproblematical, especially since the contact pressure on the points of the rough interface 11 is many times greater than on a mirror-smooth metal surface.

Figure 8:
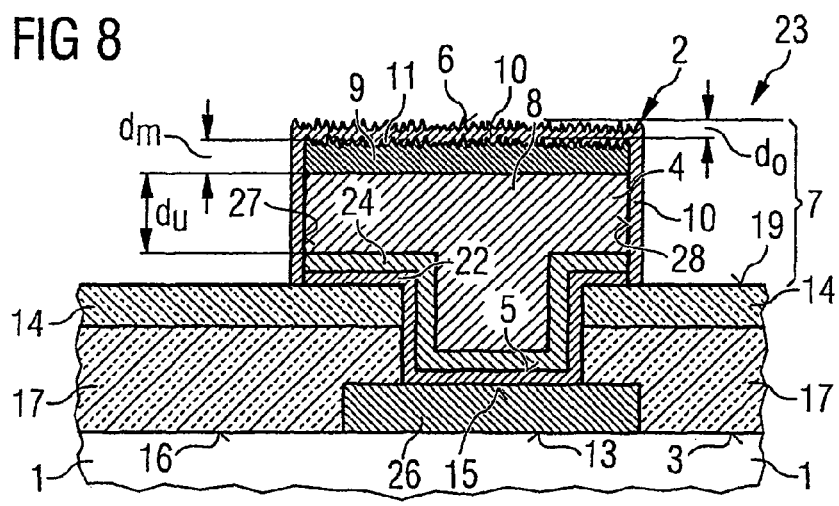

FIG. 8 shows a schematic cross section of the upper side region 16 according to FIG. 7 after completion of the metal coating structure 2 and after separation of the semiconductor wafer into individual semiconductor chips 1. The corrosion protection both for the copper and for the nickel is ensured by there then being a precious metal coating applied around the surfaces of the interconnects 4 or the contact terminal areas 15 of copper-containing or nickel-containing material. This application also to the edge sides 27 and 28 of the metal layers 7 again requires an adjusting step by means of a photoresist technique.

Figure 9:
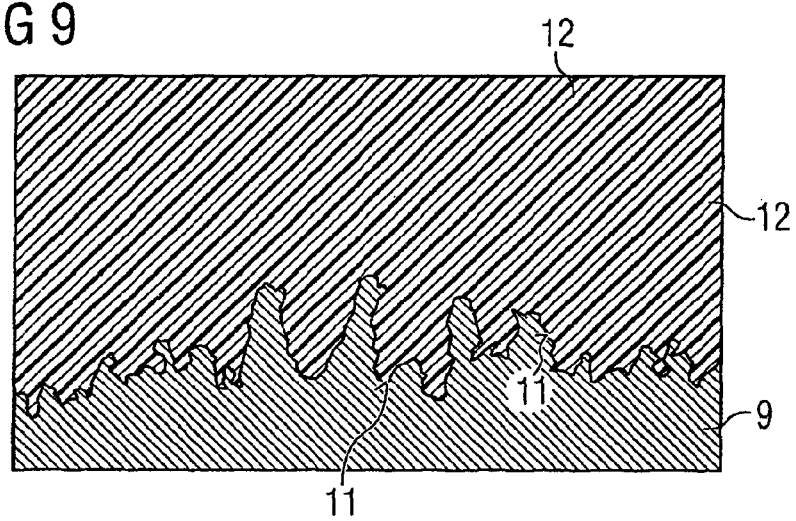
FIG. 9 shows a schematic cross section of an interface between a central metal layer comprising nickel and a plastic package molding compound of a semiconductor device.

FIG. 9 shows a schematic cross section of an interface 11 between a central metal layer 9 comprising nickel and a plastic package molding compound 12. It is possible to dispense with a precious metal coating in regions that are covered by the plastic package molding compound 12, especially since the interlocking between the plastic package molding compound 12 and the rough interface 11 of the central metal layer 9 of nickel is intensive, as is shown by this schematic representation obtained from a scanning electron microscope photo. In this case, the rough interface 11 may comprise different structures from spherical through fibrous or whisker-like to dendritic forms.

What is claimed is:

1. A semiconductor device comprising a semiconductor chip, the semiconductor chip comprising:
    a bonding wire; and
    a metal coating structure on an active upper side of the semiconductor chip, the metal coating structure comprising:
        precious-metal-containing bonding areas on the upper side of the semiconductor chip, and
        a plurality of metal layers arranged one on top of the other and comprising:
            a copper-containing lower metal layer forming interconnects and contact terminal areas,
            a central metal layer comprising at least one of nickel and nickel phosphide, covering the lower metal layer, and
            an upper metal layer comprising a precious metal, covering at least the bonding areas and, the bonding wire being attached to the upper metal layer, the upper metal layer having a total thickness $d_o$ such that $0.1\ \mu m \leq d_o \leq 1.0\ \mu m$,
            wherein the central metal layer has a rough interface with respect to the upper metal layer such that an average roughness height $t_m$ of the central metal layer is $0.05\ \mu m \leq t_m \leq 1.00\ \mu m$.

2. The semiconductor device according to claim 1, wherein a roughness of the interface of the central metal layer is formed galvanically in a front-end process by variation of current densities during deposition.

3. The semiconductor device according to claim 1, wherein a roughness of the interface of the central metal layer is such that there is great adhesiveness with respect to the plastic package molding compound, and the roughness of the interface of the central metal layer is further such that a bondability of the bonding areas is not impaired.

4. The semiconductor device according to claim 1, wherein a thickness $d_u$ of the lower copper-containing metal layer of the coating structure is $2\ \mu m \leq d_u \leq 50\ \mu m$.

5. The semiconductor device according to claim 1, wherein a diffusion-inhibiting metal layer comprising at least one of tungsten and titanium is arranged between the copper-containing metal layer of the contact terminal areas and the contact areas of the semiconductor chip, which are in connection with the electrodes of semiconductor elements of the semiconductor chip.

6. The semiconductor device according to claim 1, wherein a metal layer comprising at least one of tungsten and titanium is arranged as a diffusion barrier between the copper-containing metal layer of the interconnects and the passivation layers of the upper side of the semiconductor chip.

7. The semiconductor device according to claim 1, wherein cross sections of the interconnects of the metal coating structure have such dimensions that the interconnects are capable of carrying source or emitter currents of power semiconductor chips.

8. The semiconductor device according to claim 1, wherein the metal coating structure covers a proportion of a surface area ΔF of the active upper side of the semiconductor chip, with ΔF 50%.

9. The semiconductor device according to claim 1, wherein the semiconductor device is a power device.

10. A power semiconductor module comprising a semiconductor chip, the semiconductor chip comprising:
    a bonding wire; and
    a metal coating structure on an active upper side of the semiconductor chip, the metal coating structure comprising:
        precious-metal-containing bonding areas on the upper side of the semiconductor chip, and
        a plurality of metal layers arranged one on top of the other and comprising:
            a copper-containing lower metal layer forming interconnects and contact terminal areas,
            a central metal layer comprising at least one of nickel and nickel phosphide, covering the lower metal layer, and
            an upper metal layer comprising a precious metal, covering at least the bonding areas, the bonding wire being attached to the upper metal layer, the upper metal layer having a total thickness $d_o$ such that $0.1\ \mu m \leq d_o \leq 1.0\ \mu m$,
            wherein the central metal layer has a rough interface with respect to the upper metal layer such that an average roughness height $t_m$ of the central metal layer is $0.05\ \mu m \leq t_m \leq 1.00\ \mu m$.

11. A semiconductor chip comprising a metal coating structure on an active upper side of the semiconductor chip, the metal coating structure comprising:
    precious-metal-containing bonding areas on the active upper side;
    a plurality of metal layers arranged one on top of the other and comprising:
        a copper-containing lower metal layer forming interconnects and contact terminal areas,
        a central metal layer, comprising at least one of nickel and nickel phosphide, covering the lower metal layer, and
        an upper metal layer comprising palladium, covering at least the bonding areas, the upper metal layer having a total thickness $d_o$ such that $0.1\ \mu m \leq d_o \leq 1.0\ \mu m$,
        wherein the central metal layer has a rough interface with respect to the upper metal layer such that an average roughness height $t_m$ of the central metal layer is $0.05\ \mu m \leq t_m \leq 1.00\ \mu m$; and
    a bonding wire attached to the upper metal layer.

12. The semiconductor chip according to claim 11, wherein a roughness of the interface of the central metal layer is formed galvanically in a front-end process by variation of current densities during deposition.

13. The semiconductor chip according to claim 11, wherein a roughness of the interface of the central metal layer is such that there is great adhesiveness with respect to the plastic package molding compound, and the roughness of the interface of the central metal layer is further such that a bondability of the bonding areas is not impaired.

14. The semiconductor chip according to claim 11, wherein a thickness $d_u$ of the lower copper-containing metal layer of the coating structure is 2 µm$\leq d_u \leq$50 µm.

15. The semiconductor device of according to claim 1, wherein the upper metal layer covers only the bonding areas, and wherein the central metal layer further has a rough interface with respect to a plastic package molding compound surrounding the metal coating structure.

16. The semiconductor chip according to claim 11, wherein the upper metal layer covers only the bonding areas, and wherein the central metal layer further has a rough interface with respect to a plastic package molding compound surrounding the metal coating structure.

17. The semiconductor device of claim 1, wherein the upper metal layer has an upper surface that is rough, the bonding wire being connected to the rough upper surface of the upper metal layer.

18. The power semiconductor module of claim 10, wherein the upper metal layer has an upper surface that is rough, the bonding wire being connected to the rough upper surface of the upper metal layer.

19. The semiconductor chip of claim 11, wherein the upper metal layer has an upper surface that is rough, the bonding wire being connected to the rough upper surface of the upper metal layer.

20. A semiconductor device comprising a semiconductor chip, the semiconductor chip comprising a metal coating structure on an active upper side of the semiconductor chip, the metal coating structure comprising:
   precious-metal-containing bonding areas on the active upper side;
   a plurality of metal layers arranged one on top of the other and comprising:
      a copper-containing lower metal layer forming interconnects and contact terminal areas,
      a central metal layer, comprising at least one of nickel and nickel phosphide, covering the lower metal layer, and
      an upper metal layer comprising palladium, covering at least the bonding areas, the upper metal layer having a total thickness $d_o$ such that 0.1 µm$\leq d_o \leq$1.0 µm,
      wherein the central metal layer has a rough interface with respect to the upper metal layer such that an average roughness height $t_m$ of the central metal layer is 0.05 µm$\leq t_m \leq$1.00 µm; and
   a bonding wire attached to the upper metal layer.

21. The semiconductor device of claim 20, wherein the upper metal layer has an upper surface that is rough, the bonding wire being connected to the rough upper surface of the upper metal layer.

22. A power semiconductor module comprising a semiconductor chip, the semiconductor chip comprising a metal coating structure on an active upper side of the semiconductor chip, the metal coating structure comprising:
   precious-metal-containing bonding areas on the active upper side;
   a plurality of metal layers arranged one on top of the other and comprising:
      a copper-containing lower metal layer forming interconnects and contact terminal areas,
      a central metal layer, comprising at least one of nickel and nickel phosphide, covering the lower metal layer, and
      an upper metal layer comprising palladium, covering at least the bonding areas, the upper metal layer having a total thickness $d_o$ such that 0.1 µm$\leq d_o \leq$1.0 µm,
      wherein the central metal layer has a rough interface with respect to the upper metal layer such that an average roughness height $t_m$ of the central metal layer is 0.05 µm$\leq t_m \leq$1.00 µm; and
   a bonding wire attached to the upper metal layer.

23. The power semiconductor module of claim 22, wherein the upper metal layer has an upper surface that is rough, the bonding wire being connected to the rough upper surface of the upper metal layer.

* * * * *